(12) United States Patent
Ohira et al.

(10) Patent No.: US 6,751,861 B2
(45) Date of Patent: Jun. 22, 2004

(54) PRINTED CIRCUIT BOARD MANUFACTURING METHOD

(75) Inventors: Kazuhide Ohira, Kanagawa (JP); Teturou Uchida, Kanagawa (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 09/940,655

(22) Filed: Aug. 29, 2001

(65) Prior Publication Data

US 2002/0023344 A1 Feb. 28, 2002

Related U.S. Application Data

(63) Continuation of application No. 09/296,486, filed on Apr. 22, 1999, now abandoned.

(30) Foreign Application Priority Data

Apr. 24, 1998 (JP) ............................................ 10-131134

(51) Int. Cl.$^7$ .............................. H05K 3/02; H05K 3/10
(52) U.S. Cl. ............................ 29/846; 29/840; 174/250; 361/748
(58) Field of Search .................... 29/840, 846; 174/250, 174/254, 255; 361/748, 749

(56) References Cited

U.S. PATENT DOCUMENTS

| | | | |
|---|---|---|---|
| 4,296,542 A | 10/1981 | Gotman | 29/574 |
| 4,316,235 A * | 2/1982 | Latasiewicz | 361/681 |
| 4,970,775 A | 11/1990 | Brown et al. | 29/602.1 |
| 5,143,423 A | 9/1992 | LeBegue et al. | |
| 5,369,875 A | 12/1994 | Utsunomiya et al. | 29/621.1 |
| 5,421,082 A * | 6/1995 | Errichiello | 29/846 |
| 5,773,764 A * | 6/1998 | von Vajna | 174/250 |
| 5,832,585 A | 11/1998 | Takiar et al. | 29/424 |

* cited by examiner

Primary Examiner—Richard Chang
(74) Attorney, Agent, or Firm—Whitham, Curtis & Christofferson, P.C.

(57) ABSTRACT

A method for manufacturing two kinds of printed circuit boards from one master board, comprises the steps of preparing the master board, forming slits on the master board to define a first circuit area, and executing: (a) forming first cut grooves extending substantially perpendicular to the slits so as to across outer side of both ends of the slits on the master board to define a second circuit area which surrounds the first circuit area, and cutting the master board along the first cut grooves to separate a first individual circuit board including the first and second circuit areas, or (b) forming second cut grooves on the master board so as to across both ends of the slits, and cutting the master board along the second cut grooves to separate a second individual circuit board including only the first circuit area.

22 Claims, 2 Drawing Sheets

PRINTED CIRCUIT BOARD MANUFACTURING METHOD

This application is a continuation of application Ser. No. 09/296,486, which was filed on Apr. 22, 1999 now ABN, the contents of which is incorporated herein by reference.

BACKGROUND OF THE INVENTION

This invention relates to a method for manufacturing a printed circuit board, and more particularly to a method for manufacturing two kinds of printed circuit boards different in configuration from one kind of master board.

A both-sides printed circuit board is such that circuit patterns are printed on both sides of an insulated board, and circuit parts are mounted on each of the two sides. Since devices can be mounted on both sides of the printed board, the both-sides printed circuit board is preferably employed for a device which must be small in size and high in mounting density. The configuration (or size) of a both-sides printed circuit board depends on the location where it is mounted. Boards different in size are formed with different metal molds. Therefore, in the case where two kinds of both-sides printed circuit boards different from each other only in size are manufactured, it is necessary to prepare two kinds of metal molds although similar circuit pattern is printed on the boards.

For instance, in a system that an operator located away from a work machine such as a crane is remote-controlled by an operator, an operating unit is arranged in the vicinity of the operator, and a control unit which is in pair with the operating unit is provided on the work machine side. In this case, the operating unit used by the operator is portable, and therefore it is necessary that the operating unit is as small in size as possible. On the other hand, the control unit provided on the work machine side is fixedly set, and therefore it is not always unnecessary that it is extremely small in size. In the above-described system, generally the printed circuit board for the operating unit and the printed circuit board for the control unit are designed separately and manufactured. Hence, as was described above, it is necessary to prepare two kinds of printed circuit boards and metal molds for forming the boards.

The internal circuits of the operating unit and the control unit, which are used in pair in one and the same system, include a lot of common parts. Accordingly, it is preferable to employ common (the same) printed circuit boards, because it is economical. However, to do so, it is necessary to solve a problem of formation of circuits of the parts other than the aforementioned same parts.

SUMMARY OF THE INVENTION

It is therefore an object of the present invention is to provide a printed circuit board manufacturing method which is able to form two kinds of printed circuit boards different in configuration from one kind of master board.

In order to achive the above object, there is provided a method for manufacturing two kinds of printed circuit boards from one master board, comprising the steps of: preparing the master board; forming slits on the master board to define a first circuit area; executing one of the following steps (a) and (b):

(a) forming first cut grooves extending substantially perpendicular to the slits so as to cross outer sides of both ends of slits on the master board to define a second circuit area which surrounds the first circuit area; and cutting the master board along the first cut grooves to separate a first individual circuit board including the first and second circuit areas;

(b) forming second cut grooves on the master board so as to cross both ends of the slits; and cutting the master board along the second cut grooves to separate a second individual circuit board including only the first circuit area.

The first and second individual circuit boards are to be used for circuit units which are employed in pair with each other, and circuit elements used in common to the pair of circuit units are to be mounted on the first circuit area.

The pair of circuit units are a control unit circuit and an operating unit circuit for operating the control circuit board, and the first individual circuit board is to be used for the control unit and the second individual circuit board is to be used for the operating unit circuit.

In a case where a plurality of individual circuit boards are manufactured from one master board, the manufacturing method comprises the steps of: preparing the master board; forming first slits on the master board to respectively define a first circuit area; forming at least one second slit extending substantially parallel to the first slits between the respective first circuit areas, the second slit being longer than the first slits to respectively define a second circuit area which surrounds the first circuit area; executing one of the following steps (a) and (b):

forming first cut grooves on the master board so as to cross both ends of the second slit; and cutting the master board along the first cut grooves to separate a plurality of first individual circuit boards respectively including only the first and second circuit areas;

(b) forming second cut grooves on the master board so as to cross both ends of the slits; and cutting the master board along the second cut grooves to separate a plurality of second individual circuit boards respectively including only the first circuit area.

DETAILED DESCRIPTION OF THE PREFERRED EMBODIMENTS

One preferred embodiment according to the present invention will be described below in detail with reference to the accompanying drawings.

Figure 1:
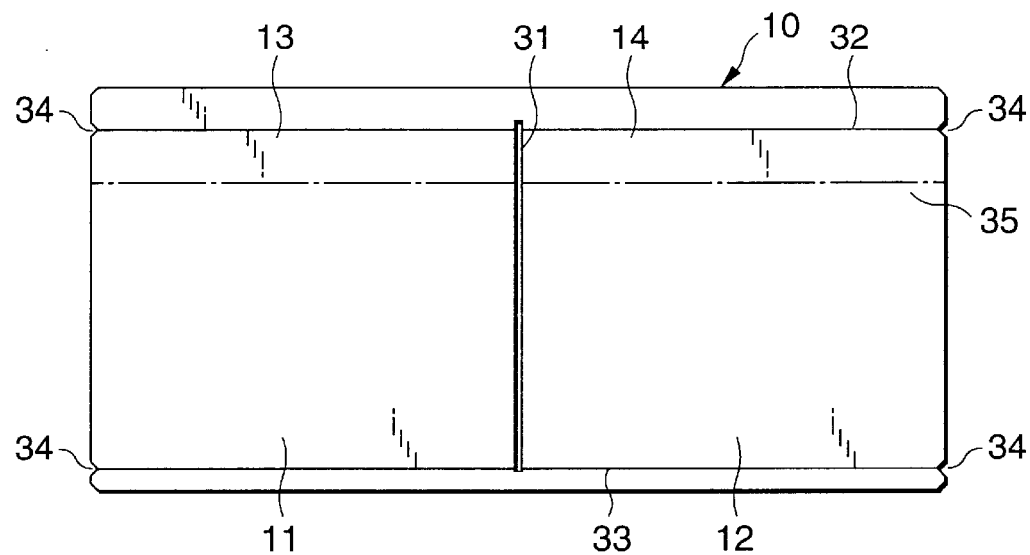
FIG. 1 is a plan view showing a master board used in a method according to the present invention.
Figure 2A:
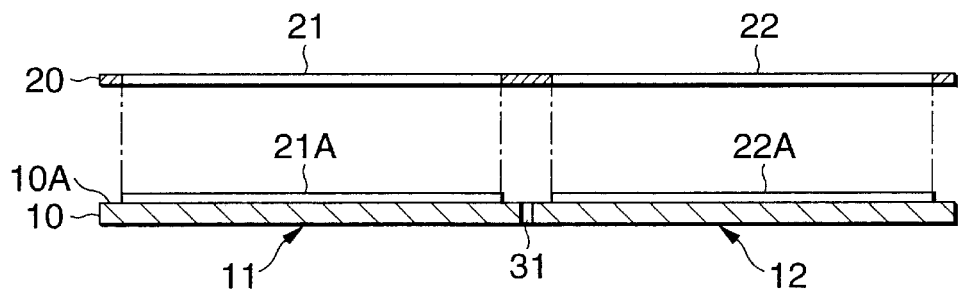
FIGS. 2(A) and (B) are sectional side views showing a printing step of the method according to the present invention.
Figure 2B:
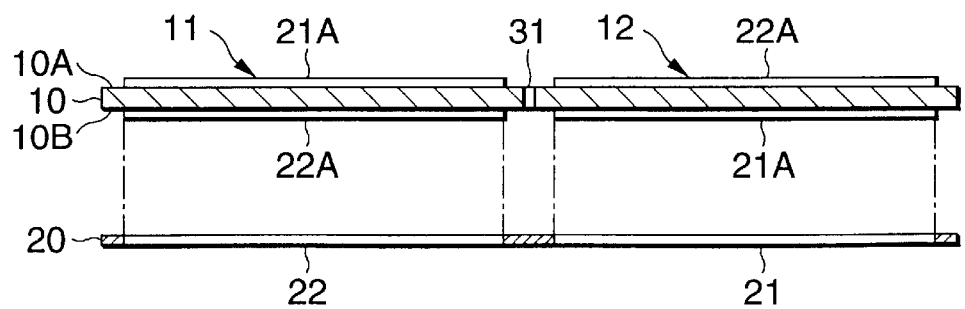

FIG. 1 is a plan view showing a both-sides print type master board 10 according to the present invention. This master board 10 is manufactured by a manufacturing method of one embodiment according to the present invention which comprises steps shown in FIGS. 2(A) and (B). In the manufacturing method of the present invention, there is first prepared a master mask 20 in which a first printing mask 21 and a second printing mask 22 are arranged in one and the same plane. The first printing mask 21 and the second printing mask 22 is respectively used for printing a first pattern 21A and a second pattern 22A on both sides of individual boards 11 and 12 which are in required size. On the other hand, a master board 10 is prepared which is at least twice as large in size than each of the individual boards 11 and 12. Thereafter, as shown in FIG. 2(A), the master mask 20 is used to print the first and second patterns 21A and 22A on the front surface 10A of the master board 10. Next, as shown in FIG. 2(B), the same master mask 20 is used again, to print the same first and second patterns 21A and 22A on the rear surface 10B of the master board 10 in such a manner that they are opposite in position to those on the front surface 10A.

Figure 3A:
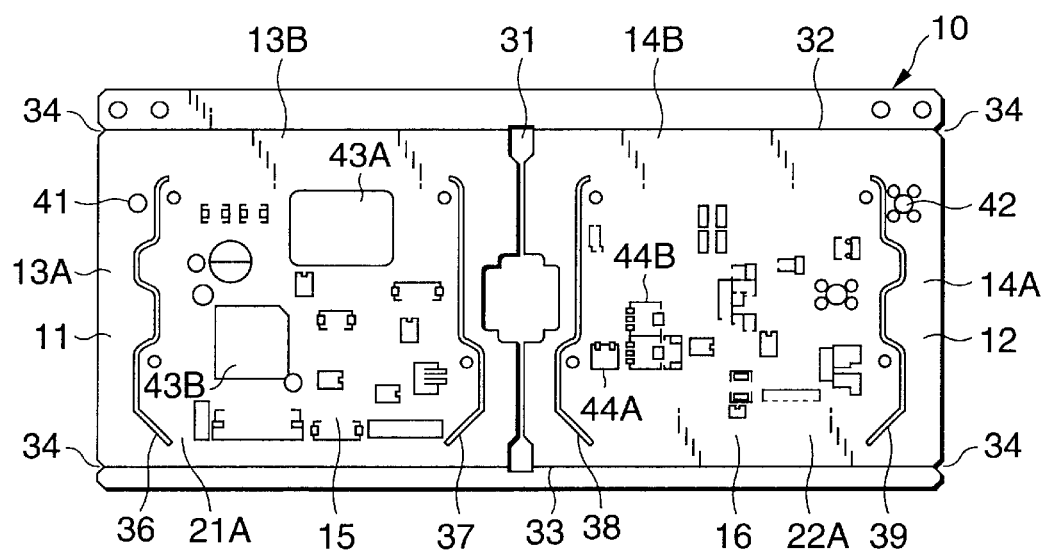
FIGS. 3(A) and (B) are plan views showing a groove forming step of the method according to the present invention.
Figure 3B:
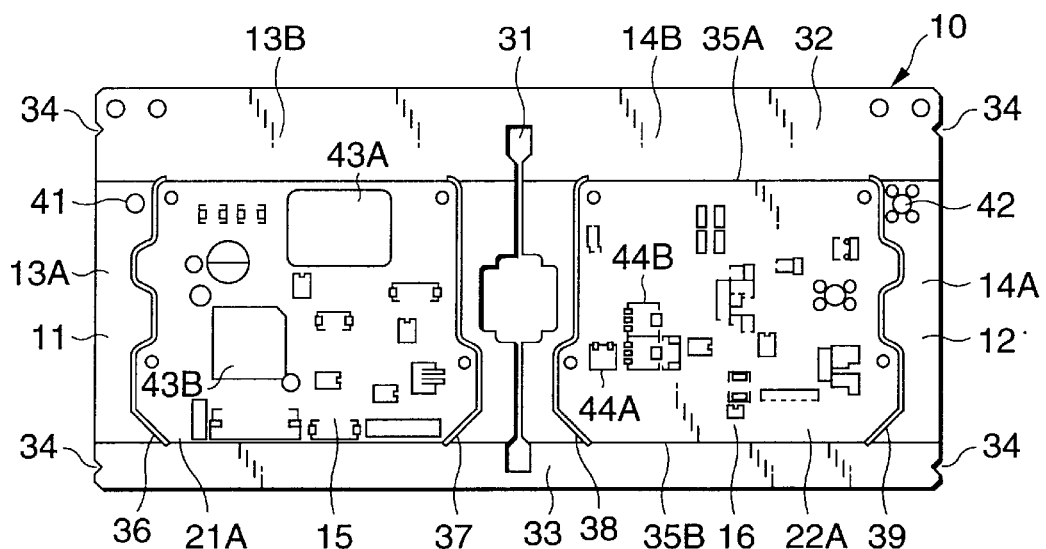

FIG. 3(A) is a plan view showing one example of a printed circuit board capable of being used for a control unit circuit which is employed in pair with an operating unit circuit shown in FIG. 3(B).

The plan view shows a first pattern 21A which corresponds to the fundamental board 15 of one individual board 11, and a second pattern 22A which corresponds to the fundamental board 16 of the other individual board 12. Slits 36 and 37 are formed on both sides of the first pattern 21A, respectively. Similarly, slits 38 and 39 are formed on both sides of the second pattern 22A, respectively. A slit 31 as a border line between the two individual boards 11 and 12 is formed therebetween. An expansion board 13A, which is located outside of the slit 36 of the first pattern 21A, has a hole 41 to which a control unit antenna is secured. An expansion board 14A, which is located outside of the slit 39 of the second pattern 22A, also has a hole 42 to which an antenna is secured. The upper portion of the fundamental board 15 is to be an expansion board 13B, and the upper portion of the fundamental board 16 is to be an expansion board 14B.

The master board 10 having such a configuration previously prepared. Then, two grooves 32 and 33 are formed on the master board 10 so as to cross both ends of the slit 31. Those grooves 32 and 33 are formed by cutting the master board 10 in the direction of thickness, and are to physically separate the two individual boards 11 and 12 along the slit 31 by application of mechanical force. There are formed notches 34 at both ends of the respective grooves 32 and 33.

Thereafter, circuit parts 43A and 43B are mounted on the first pattern 21A and secured by soldering or the like. Similarly, circuit parts 44A and 44B are mounted on the second pattern 22A and secured by soldering or the like. On the expansion regions 13A, 13B, 14A and 14B, additional circuit parts for the control unit circuit are mounted when necessary.

The master board 10 thus formed is cut (folded) along the grooves 32 and 33, to obtain two individual circuit boards for the control unit circuit respectively including both of the fundamental board and the expansion board. In a case where a printed circuit board used for the operating unit circuit from the master board 10, as shown in FIG. 3(B), two grooves 35A and 35B are formed on the master board so as to cross slightly inside both ends of the slits 36, 37, 38, and 39. The grooves 35A and 35B are formed by cutting the master board 10 in the direction of thickness, and are to physically separate the two fundamental boards 15 and 16 along the slits 36, 37, 38, and 39 by application of mechanical force.

Thereafter, circuit parts 43A and 43B are mounted on the first pattern 21A and secured by soldering or the like. Similarly, circuit parts 44A and 44B are mounted on the second pattern 22A and secured by soldering or the like.

The master board 10 thus formed is cut (folded) along the grooves 35A and 35B, to obtain two individual circuit boards for the operating unit circuit respectively including the fundamental board only.

The aforementioned master board 10 has expansion regions 13A, 13B, 14A and 14B which are continuous to the outside of the regions of the two fundamental boards 15 and 16. In this case, each of the first and second patterns 21A and 22A has a fundamental circuit which is in common with that in the operating unit circuit and the control unit circuit. And, in the expansion regions 13A, 13B, 14A and 14B, additional circuit parts of the control unit circuit are mounted when necessary. According to the configuration, the individual boards 11 and 12, which are continuous with the expansion regions 13A, 13B, 14A and 14B, can be employed for the control unit circuit, and individual boards 11 and 12, from which the expansion regions 13A, 13B, 14A and 14B have been removed, can be used for the operating unit circuit.

The master board 10 is formed with one metal mold; that is, it is of one kind of configuration (external size and position of slits). However, the resultant configuration of the individual boards 11 and 12 which are obtained by dividing the master board depends on whether or not they include the expansion boards. The fundamental circuits of the individual boards 11 and 12 are equal to each other using the first and second patterns 21A and 22A in common. Hence, the both-sides printed circuit boards which include the same circuits and are different in configuration (in horizontal and vertical dimensions) can be formed with one kind of master board. More specifically, when the master board is divided along the grooves 32 and 33, then two control unit circuit individual boards are manufactured; and when it is divided along the grooves 35A and 35B, then two operating unit circuit individual boards are manufactured.

As has been described heretofore, according to the present invention, it is possible to manufacture two printed circuit boards different in configuration by using only one kind of master board.

Although the present invention has been shown and described with reference to specific preferred embodiment, various changes and modifications will be apparent to those skilled in the art from the teachings herein. Such changes and modifications as are obvious are deemed to come within the spirit, scope and contemplation of the invention as defined in the appended claims.

What is claimed is:

1. A method for making printed circuit boards, comprising:

providing a board;

forming first slits on the board, said first slit defining printed circuit boards of a first size; and forming a second slit on the board, said second slit defining printed circuit boards of a second size which is smaller than said first size;

selectively forming first grooves on the board which extend across only said first slit, so that the board may be cut along the first grooves to separate the printed circuit boards of said first size; or forming second grooves on the board which extend across said first slit and said second slits, so that the board may be cut along the second grooves to separate the printed circuit boards of said second size.

2. The method of claim 1, wherein each of the printed circuit boards of said first size includes a second circuit area adjacent a first circuit area, and wherein each of the printed circuit boards of said second size includes said first circuit area only.

3. The method of claim 1, wherein each of said second slits contains only one elongated hole.

4. The method of claim 1, further comprising:
forming different circuit patterns in respective areas on front surfaces of the printed circuit boards of said first size.

5. The method of claim 1, further comprising:
forming different circuit patterns in respective areas on front and back surfaces of each of the printed circuit boards of said first size.

6. The method of claim 5, wherein a first circuit pattern on the front surface of one of the printed circuit boards of said first size is also formed on the back surface of another of the printed circuit boards of said first size, and wherein a second circuit pattern formed on the back surface of said one of the printed circuit boards of said first size is also formed on the front surface of said another of the printed circuit boards of said first size.

7. The method of claim 1, further comprising:
forming the board from a single mold.

8. A method for making printed circuit boards, comprising:
providing a first board;
forming a first circuit pattern and a second circuit pattern on the first board;
forming a first slit on the first board, said first slit defining printed circuit boards of a first size; and
forming second slits on the first board, said second slit defining printed circuit boards of a second size which is smaller than said first size;
forming grooves on the first board which extend across only said first slit;
cutting the first board along the grooves to separate the first board into printed circuit boards of said first size, wherein one of the separated printed circuit boards of said first size includes said first circuit pattern and another of the separated printed circuit boards of said first size includes said second circuit pattern;
providing a second board;
forming said first circuit pattern and said second circuit pattern on the second board;
forming a first slit on the second board, said first slit defining printed circuit boards of said first size; and
forming second slits on the second board, said second slits defining printed circuit boards of said second size;
forming grooves on the second board which extend across said first slit and said second slits on said second board; and
cutting the second board along the grooves to separate the second board into printed circuit boards of said second size, wherein one of the separated printed circuit boards of said second size includes said first circuit pattern and another of the separated printed circuit boards of said second size includes said second circuit pattern;
wherein said first circuit pattern and said second circuit pattern form a pair of circuit units employed within a common system.

9. The method of claim 8, wherein each of the printed circuit boards of said second size includes a second circuit area adjacent a first circuit area, and wherein each of the printed circuit boards of said first size includes said first circuit area only.

10. The method of claim 8, wherein each of the printed circuit boards of said first size includes a second circuit area adjacent a first circuit area, and wherein each of the printed circuit boards of said second size includes said first circuit area only.

11. The method of claim 10, further comprising:
mounting circuit elements which are common to said first circuit pattern and said second circuit pattern within the first circuit area on respective printed circuit boards of said first size and said second size.

12. A method for manufacturing two kinds of printed circuit board from one master board, comprising the steps of:
preparing a master board;
forming slits on the master board to define first and second circuit areas;
selectively forming first cut grooves on the master board extending substantially perpendicular to but not intersecting the slits so that when the master board is cut along the first cut grooves to separate a first kind of printed circuit board, the first kind of printed circuit board includes both first and second areas; or
forming second cut grooves on the master board extending substantially perpendicular to and intersecting the slits so that when the master board is cut along the second cut grooves to separate a second kind of printed circuit board, the second kind of printed circuit board includes only the first circuit area.

13. The method for manufacturing two kinds of printed circuit boards from one master board as recited in claim 12, wherein the step of preparing the master board comprises the steps of:
forming a slit substantially bisecting the master board in half, the slit extending to within a predetermined distance from opposite edges of the master board;
preparing a mask defining circuits in said first and second areas for a front side and a back side of printed circuit boards formed from the master board;
simultaneously printing a front side circuit on a first half of a first surface of the master board and printing a back side circuit on a second half of the first surface of the master board; and
simultaneously printing a back side circuit on the first half of a second surface of the master board and printing a front side circuit on the second half of the second surface of the master board;
whereby either of said first cut grooves or said second cut grooves intersect the slit substantially bisecting the master board so that when the master board is cut along either of said first cut grooves or said second cut grooves, two identical printed circuit boards of either said first kind or said second kind are formed.

14. The method for manufacturing two kinds of printed circuit boards from one master board as recited in claim 12, wherein the first and second kinds of printed circuit boards are used in pairs in complementary circuit units.

15. The method for manufacturing two kinds of printed circuit boards from one master board as recited in claim 14, wherein the complementary circuit units are a control unit circuit and an operating unit circuit for operating the control unit circuit.

16. The method for manufacturing two kinds of printed circuit boards from one master board as recited in claim 15, wherein the control unit circuit employs the first kind of printed circuit board and the operating unit circuit employs the second kind of printed circuit board.

17. A method as recited in claim 12, wherein a cutting of said master board in one of said plurality of regions crosses a slit such that a circuit board is formed having both said first circuit area and said second circuit area.

18. A method as recited in claim 12, wherein a cutting of said master board in one of said plurality of regions crosses a slit such that a circuit board is formed having only said first circuit area.

19. A method for manufacturing two kinds of printed circuit boards from one master board, comprising the steps of:

preparing a master board having at least one slit substantially dividing the master board into two or more portions, the at least one slit extending to within a predetermined distance from opposite edges of the master board;

preparing a mask defining circuits in first and second areas for a front side and a back side of printed circuit boards formed from said two or more portions of the master board;

simultaneously printing a front side circuit on a first portion of a first surface of the master board and printing a back side circuit on a second portion of the first surface of the master board;

simultaneously printing a back side circuit on the first portion of a second surface of the master board and printing a front side circuit on the second portion of the second surface of the master board;

forming slits on the master board to define first and second circuit areas within each of the first portion and the second portion of the master board; and selectively forming first cut grooves on the master board extending substantially perpendicular but not intersecting said slits so that when the master board is cut along the first cut grooves to separate a first kind of printed circuit board, the first kind of printed circuit board includes both said first and second circuit areas; or forming second cut grooves on the master board extending substantially perpendicular to and intersecting the slits so that when the master board is cut along the second cut grooves to separate a second kind of printed circuit board, the second kind of printed circuit board includes only the first circuit area;

whereby either of said first cut grooves or said second cut grooves intersect the slit substantially dividing the master board so that when the master board is cut along either of said first cut grooves or said second cut grooves, a plurality of identical printed circuit boards of either said first kind or said second kind are formed.

20. The method for manufacturing two kinds of printed circuit boards from one master board as recited in claim 19, wherein the first and second kinds of printed circuit boards are used in pairs in complementary circuit units.

21. The method for manufacturing two kinds of printed circuit boards from one master board as recited in claim 20, wherein the complementary circuit units are a control unit circuit and an operating unit circuit for operating the control unit circuit.

22. The method for manufacturing two kinds of printed circuit boards from one master board as recited in claim 21, wherein the control unit circuit employs the first kind of printed circuit board and the operating unit circuit employs the second kind of printed circuit board.

* * * * *